United States Patent [19]

Hills et al.

[11] Patent Number: 4,713,769

[45] Date of Patent: Dec. 15, 1987

[54] METHOD AND APPARATUS FOR LOCATING AND DISPLAYING HISTORICAL INFORMATION WITHIN AN ELECTRONIC POSTAGE METER

[75] Inventors: Karen F. Hills, Norwalk; Howell A. Jones, Southport, both of Conn.

[73] Assignee: Pitney Bowes Inc., Stamford, Conn.

[21] Appl. No.: 774,775

[22] Filed: Sep. 11, 1985

[51] Int. Cl.[4] .................... G06F 15/20; G06G 7/48
[52] U.S. Cl. .................................................. 364/464
[58] Field of Search ............................. 364/464, 466

[56] References Cited

U.S. PATENT DOCUMENTS

| | | | |
|---|---|---|---|
| 3,978,457 | 8/1976 | Check, Jr. et al. | 364/900 |
| 4,122,532 | 10/1978 | Dluzos et al. | 364/900 |
| 4,566,106 | 1/1986 | Check, Jr. | 371/21 |
| 4,578,774 | 3/1986 | Muller | 364/900 |
| 4,623,987 | 11/1986 | Sederberg et al. | 364/900 |
| 4,627,016 | 12/1986 | Kirschner et al. | 364/900 |

Primary Examiner—Errol A. Krass
Assistant Examiner—Danielle Laibowitz
Attorney, Agent, or Firm—Michael J. DeSha; David E. Pitchenik; Melvin J. Scolnick

[57] ABSTRACT

A system is provided for locating and displaying a most recently written record in an electronic postage meter to sequentially store accounting data associated with the transactions of the electronic postage meter. The meter includes a first non-volatile memory (NVM) and a second non-volatile memory (NVM). The system includes apparatus for locating an accurate piece count within the second NVM, for utilizing the accurate piece count within the second NVM to locate a written transaction in the first NVM, and means for providing an external message generated by a keyboard or the like. Accordingly, the written transaction represents the most recently written record in the postage meter. The system also includes a means for determining whether the record is accurate. Accordingly, check values are provided as part of the record in the first NVM. If the check value and a value corresponding to the written transaction agree, the record within the first NVM will be displayed to a user. If the values disagree, an error indication will be displayed to the user. A key sequence on a keyboard or the like within the electronic postage meter can be depressed to either display ascending or descending register information, as the case may be, depending upon which portion of the first NVM the user would like to access. This system can be utilized in a repetitive manner to access and display sequentially stored information within the first NVM and to verify the accuracy of the stored information.

4 Claims, 3 Drawing Figures

METHOD AND APPARATUS FOR LOCATING AND DISPLAYING HISTORICAL INFORMATION WITHIN AN ELECTRONIC POSTAGE METER

FIELD OF THE INVENTION

The present invention relates to electronic postage meters, and more specifically to a non-volatile memory (NVM) system with real time and power down data storage capability for an electronic postage meter.

BACKGROUND OF THE INVENTION

Various electronic postage meter systems have been developed, as for example, the systems disclosed in U.S. Pat. No. 3,978,457 for Microcomputerized Electronic Postage Meter Systems, U.S. Pat. No. 3,938,095 for Computer Responsive Postage Meter, European Patent Application No. 80400603.9, filed May 5, 1980, for Electronic Postage Meter Having Improved Security and Fault Tolerance Features, U.S. Pat. No. 4,301,507, for Electronic Postage Meter Having Plural Computing Systems, and copending application Ser. No. 447,815, filed Dec. 8, 1982 now U.S. Pat. No. 4,579,054, for Stand-Alone Electronic Mailing Machine.

Generally electronic postage meters include some form of non-volatile memory capability to store critical postage accounting information. This information includes, for example, the amount of postage remaining in the meter for subsequent printing and the total amount of postage already printed by the meter. Other types of accounting or operating data may also be stored in the non-volatile memory, as desired.

However, conditions can occur in electronic postage meters where information stored in non-volatile memory may be lost. A total line power failure or fluctuation in voltage conditions can cause the microprocessor associated with the meter to operate erratically and either cause erasure of data or the writing of spurious data in the non-volatile memory. The erasure of data or the writing of spurious data in the non-volatile memory may result in a loss of critical accounting information. Since the accounting data changes with the printing of postage and is not permanently stored elsewhere, there is no way to recapture or reconstruct the lost accounting information. Under such circumstances, it is possible that a user may suffer a loss of postage funds.

To minimize the likelihood of a loss of information stored in the non-volatile memory, various approches have been adopted to insure the high reliability of eectronic postage meters. It is known from aforementioned U.S. Pat. No. 3,978,457 and aforementioned copening application Ser. No. 447,815 now U.S. Pat. No. 4,579,054 to provide a microprocessor controlled electronic postage meter having memory architecture which includes a temporary storage memory for storing accounting data reflecting each meter trasaction and a non-volatile memory to which the accounting data is transferred during the power down cycle of the meter.

Another approach for preserving the stored acounting data has been the use of redundant non-volatile mmories. One such redundant memory system is disclosed in patent application Ser. No. 343,877, filed Jan. 29, 1982, now abandoned, in the name of Frank T. Check, Jr., and entitled Eletronic Postage Meter Having Redundant Memory. With such redundant memory system the two redundant non-volatile memories are interconnected with a microprocessor by way of completely separate data and address lines to eliminate error conditions. The data may be applied to the memories simultaneously or sequentially at different times. Such a system minimizes the possibility of non-detectabl and/or non-correctable errors resulting from transients.

Another redundant memory system is disclosed in the aforementioned European Patent Application No. 80400603.9. In such patent application, accounting data is written into each of the two non-volatile memories, designated (battery augmented memories) BAMs, twice during each postage meter transaction, once in temporary form and once in permanent form to minimize the loss of accounting data during microcomputer failure.

The aforementioned redundant memory systems may help to eliminate certain errors in the accounting data due to microcomputer failure or the presence of transients. However, since writing into these memories occurs during each transaction or trip cycle of the meter, critical accounting data is written into the non-volatile memories during the noisiest cycle of meter operation when the presence of transients or spurious signals is probably greatest.

A postage meter is described in U.S. patent application Ser. No. 643,219 filed on Aug. 22, 1984 entitled NON-VOLATILE MEMORY SYSEM WITH REAL TIME AND POWER DOWN DATA STORAGE CAPABILITY FOR AN ELECTRONIC POSTAGE METER, now abandoned, issued to the Assignee of the above-mentioned application that describes a method and associated apparatus which increases the reliability of the stored accounting data which reflects the transactions of an electronic postage meter.

In the above-mentioned application, a method and associated apparatus is disclosed which provides a first non-volatile memory which is capable of storing accounting data which represents the postage meter transactions, updating this first non-volatile memory in real time for each postage transaction to provide a current record of the accounting data for each transaction on-the-fly, which provides a second non-volatile memory capable of storing accounting data representing the meter transactions during a power down cycle of the meter, providing a volatile memory capable of storing accounting data which represents the postage meter transactions, updating the volatile memory in real time for each postage transaction and means for transferring the accounting data from the volatile memory to the second non-volatile memory during the power down cycle of the postage meter.

Accordingly, this application provides a system which minimizes errors in the stored accounting data. It also provides a non-volatile memory system for an electronic postage meter in which the accounting data is written into different NVMs during two different cycles of postage meter operation.

It is well known that the non-volatile memories of an electronic postage meter have accounting information within their ascending and descending register locations. This accounting information represents postal funds that have been either entered into or removed from the meter during its operation. It is important that if an electronic postage meter enters a fatal state, the accounting information can be read from the NVMs. The term fatal state means in the context of this description that the meter can no longer operate because of some problem within the circuitry or components of the meter. Accordingly, it is very important that a system be developed for use within an electronic postage meter that can be utilized to access and display certain information that is held within the non-volatile memories.

It is known that in the previous postage meters the non-volatile memory has generally been of the PMOS type such that the method of obtaining the information from the memory is to actually physically extract the device from that meter and to extract the information with another device. This has the disadvantage of preventing ready access to specific information therein. Accordingly, what is needed is a system to determine on a continuing basis the information within the non-volatile memory in an electronic postage meter particularly the accounting information that is located in the ascending and descending register locations.

SUMMARY OF THE INVENTION

It is an object of the present invention to provide a non-volatile memory system for an electronic postage meter in which accounting data is written into different NVMs during two different cycles of postage meter operation.

It is a further object of the present invention to provide a non-volatile memory system with real time and power down data storage capability for an electronic postage meter to minimize the possibility of errors in the stored accounting data.

It is a further object of the present invention to provide a non-volatile memory system which has the capability of locating and displaying a most recently written record of accounting information associated with the descending and ascending register locations.

Briefly, in accordance with the present invention, a method and associated apparatus is provided for locating and displaying a most recently written record of an electronic postage meter, including the steps of and associated apparatus for providing a first non-volatile memory capable of storing accounting data which represents the postage meter transactions; updating the first non-volatile memory in real time for each postage transaction to provide a current record of the accounting data for each postage transaction on-the-fly; providing a second non-volatile memory capable of storing the postage meter's accounting data as it exists during a power down cycle of the postage meter; locating information in the second non-volatile memory and utilizing the information located in the second non-volatile memory to locate a written transaction in the first non-volatile memory whereby the written transaction represents the most recently written record in the first NVM.

Other objects, aspects and advantages of the present invention will be apparent from the detailed description considered in conjunction with the drawings, as follows:

DETAILED DESCRIPTION

Figure 1:
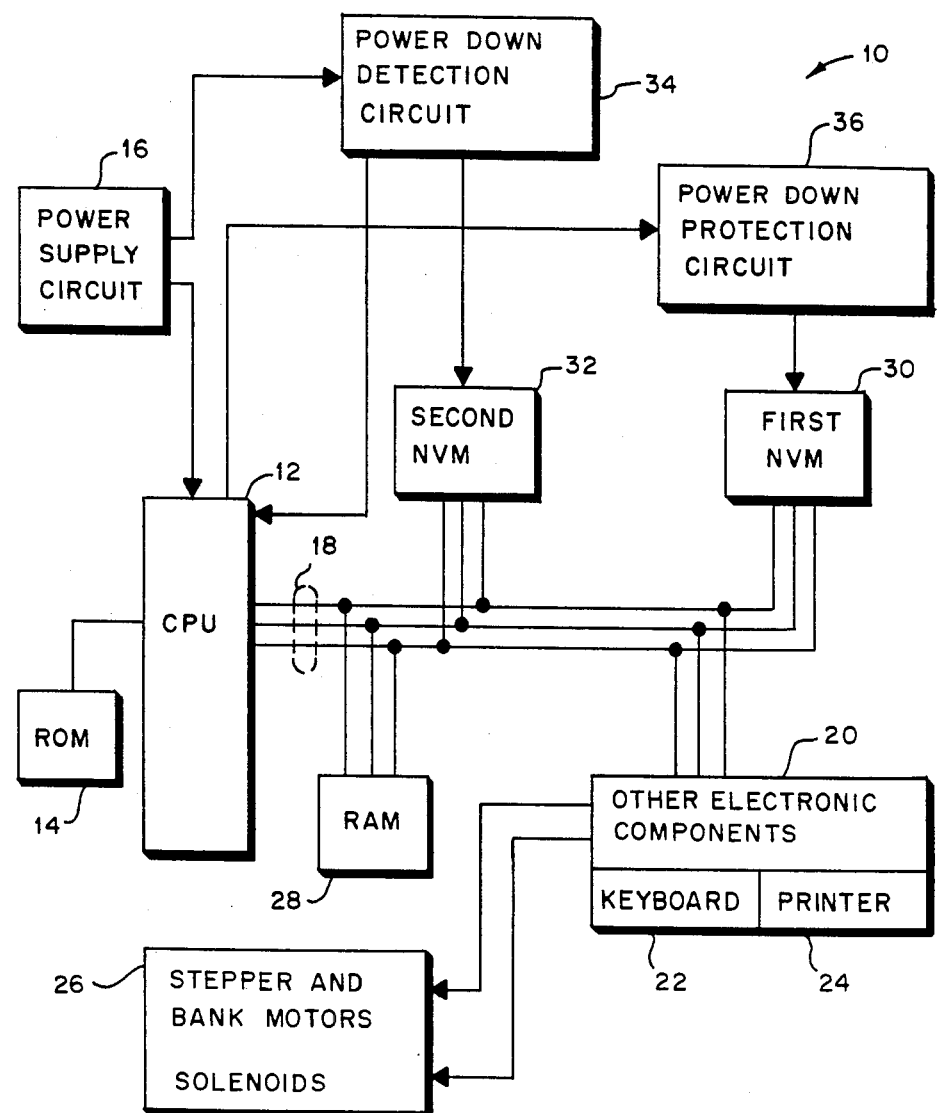
FIG. 1 is a block diagram of one embodiment for the non-volatile memory system of the present invention.

Referring to FIG. 1, a non-volatile memory system for an electronic postage meter in accordance with the present invention is generally illustrated at 10. Preferably, the general architecture of the electronic postage meter is similar to that disclosed in the aforementioned co-pending patent application Ser. No. 447,815, modified as disclosed in FIG. 1. Specifically, a central processing unit 12, in the form of a microprocessor, e.g., a Model 8085A microprocessor, is operated under program control in accordance with the programs stored in a ROM 14. The microprocessor 12 is energized by the output of a power supply circuit 16 during a power up cycle to place the meter in an operative condition. The microprocessor 12 transmits and receives signals over a data bus 18 coupled to the various meter components.

Generally, the microprocessor 12 transmits signals to and receives signals from the other electronic components 20, the keyboard 22 and the printer 24 for the actuation of stepper and bank motors and solenoids 26 to accomplish the printing of postage on a document. Each such postage operation or printing transaction is referred to as a trip cycle.

During each trip cycle, a certain amount of postage is used. A volatile random access memory 28, such as model 8155 with the appropriate input and output and timing circuits, contains an ascending register (AR), a descending register (DR) and appropriate cyclic redundancy codes (CRCs) and control sums. During each trip cycle, and under control of the microprocessor 12, the descending register is decremented the appropriate amount for the postage used during the trip and the ascending register is incremented the appropriate amount for the postage used during the trip. Thus, the AR provides a running or current total of the amount of postage that has been used through completion of the last trip cycle and the DR provides a running or current total of the anount of postage remaining in the meter for subsequent use.

Also coupled to the data bus 18 to receive accounting data from the microprocessor 12 is a first NVM 30. Preferably, the NVM 30 is an electrically erasable read only memory (EEROM) such as a 5516A memory available from SEEQ Technology, Inc., San Jose, Calif., having an endurance of 1 million write cycles. However, it should be understood that other NVMs which have high endurances may also be utilized, such as a battery backed CMOS integrated circuit chip or other similar integrated circuit chips. Under control of the microprocessor 12 the accounting data for each meter postal transaction, i.e., AR and DR, and other accounting data, as desired, is written into the NVM 30, as well as the volatile RAM 28. Thus, a permanent updated record of the accounting data is maintained on-the-fly in real time in the NVM 30.

A second NVM 32, such as an ER 3400 PMOS integrated circuit chip, is also electrically coupled to the data bus 18. Under control of the microprocessor 12, accounting data which is temporarily stored in the RAM 28 during each meter transaction is transferred from the RAM 28 and written into the second NVM 32 upon detection of a power down signal indicating commencement of a power down cycle.

During normal operation of the postage meter, the second NVM 32 is held in a non-write condition by the output signals from the microprocessor 12 over data bus 18. However, during a power failure (power down cycle), the microprocessor 12 initiates a power down cycle routine in which the accounting data which has been temporarily stored in the volatile RAM 28 is transferred or written into the first NVM 32. Upon completion of the transfer of accounting data into the second NVM 32, the second NVM 32 is disabled by a power down detection circuit 34 to prevent further writing therein by the microprocessor 12.

Advantageously, the power supply circuit 16 and the power down detection circuit 34 may be of the type disclosed in U.S. Pat. No. 4,445,198, issued Apr. 24, 1984, entitled Memory Protection Circuit For An Electronic Postage Meter. Upon receiving a first low power signal from the power supply circuit 16, the power down detection circuit 34 applies predetermined bias signals to the second NVM 32 to allow the transfer of accounting data thereto from the RAM 28 under control of the microprocessor 12. Thereafter, the bias voltages are removed from the second NVM 32 to disable the same and prevent any further writing of data therein from the microprocessor 12. Alternatively, the power supply circuit 16 and the power down detection circuit 34 may be of the type disclosed in U.S. Pat. No. 4,534,018 entitled, Non-Volatile Memory Protection Circuit With Microprocessor Interaction.

Output signals from the microprocessor 12 are also electrically coupled to a power down protection circuit 36 such as disclosed in co-pending application Serial No. 643,111, filed on Aug. 22, 1984 herewith and entitled Data Protection System For Electronic Postage Meters Having Multiple NVMs. The power down protection circuit 36 inhibits any further writing in the first NVM 30 upon detection of a power down condition by the microprocessor 12.

Figure 2:
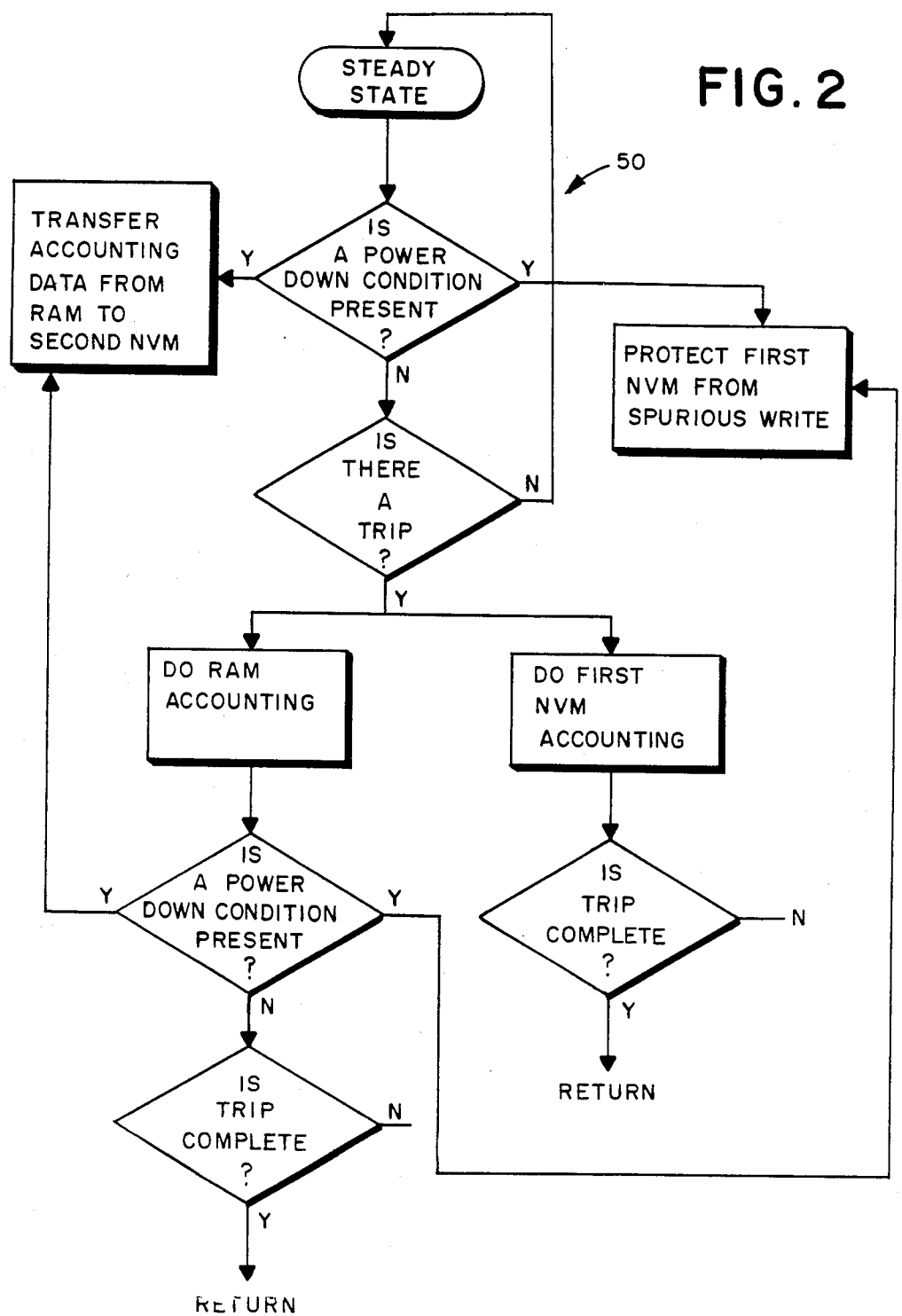
FIG. 2 is a flowchart illustrating the operation of the non-volatile memory system of the present invention.

A flowchart for the operation of the memory system of FIG. 1 is illustrated in FIG. 2 at 50. Considering this flowchart 50 and the apparatus 10 illustrated in FIG. 1, after power up of the postage meter, prior to undertaking a transaction or commencing a trip cycle, the meter is in its quiescent or steady state condition. In this condition, if the microprocessor 12 senses a power down condition, i.e., power failure, the microprocessor 12 immediately transfers all the accounting data from the RAM 28 to the second NVM 32 by writing it into the second NVM 32. Thereafter, the power down detection circuit 34 disables the second NVM 32 to preclude any further writing of spurious data therein by erratic operation of the microprocessor 12 during the remainder of the power down cycle. After the transfer of accounting data from the RAM 28 to the second NVM 32, the first NVM 30 is disabled by the power down protection circuit 36 to prevent any further writing of spurious data therein by erratic operation of the microprocessor 12 during the remainder of the power down cycle when the voltages applied to the various circuit elements are degrading towards zero volts through unspecified and undefined bias conditions.

If no power down condition is present, the microprocessor 12 waits for a trip signal indicating that a trip cycle is being commenced. When a trip is present, the accounting data in the RAM 28 is updated to reflect the results of the most recent postage transaction or trip cycle. Additionally, the accounting data for the postage transaction is written into the first NVM 30.

After writing the accounting data for the most recent transaction in RAM and the first NVM 30, the microprocessor 12 looks for a power down condition. If such a condition is present, the previously described operation is undertaken to transfer accounting data from the RAM 28 into the second NVM 32 while at the same time preventing any further writing of data into the first NVM 30. If a power down condition is not present, the microprocessor 12 looks for a trip completion signal after writing the accounting data in the RAM 28 and first NVM 30. Upon detection of a trip completion signal, the meter returns to its steady state condition where the aforementioned process may be repeated.

From the foregoing description, it should be apparent that "permanent" storage of accounting data is provided on-the-fly in real time on a transaction by transaction basis to provide a first accounting data file during one cycle of meter operation, i.e., during the trip cycle, and that "permanent" storage of accounting data is also provided during the power down cycle by transferring accounting data from temporary storage to "permanent" storage to provide a second accounting data file during another cycle of meter operation, i.e., during the power down cycle. Advantageously, the second accounting data file is permanently constructed during a period of the meter operation, i.e., the power down cycle, when spurious signals are at a minimum.

Conditions may exist in which the accounting data in the second NVM is considered questionable (data disagrees with CRC, single digit in field incorrect, etc.). In that event, the meter is programmed to not display the questionable data which is therefore not immediately available to postal authorities. The first NVM has been provided to serve as an alternate immediately accessable source for the accounting data. The second non-volatile memory is physically removed fom the meter tog detemine the information contained therein. In utilizing software which exercises the EEROM chip as the first NVM, it is possible to determine the contents of the ascending and descending register locations of an electronic postage meter without removing the memory.

Figure 3:
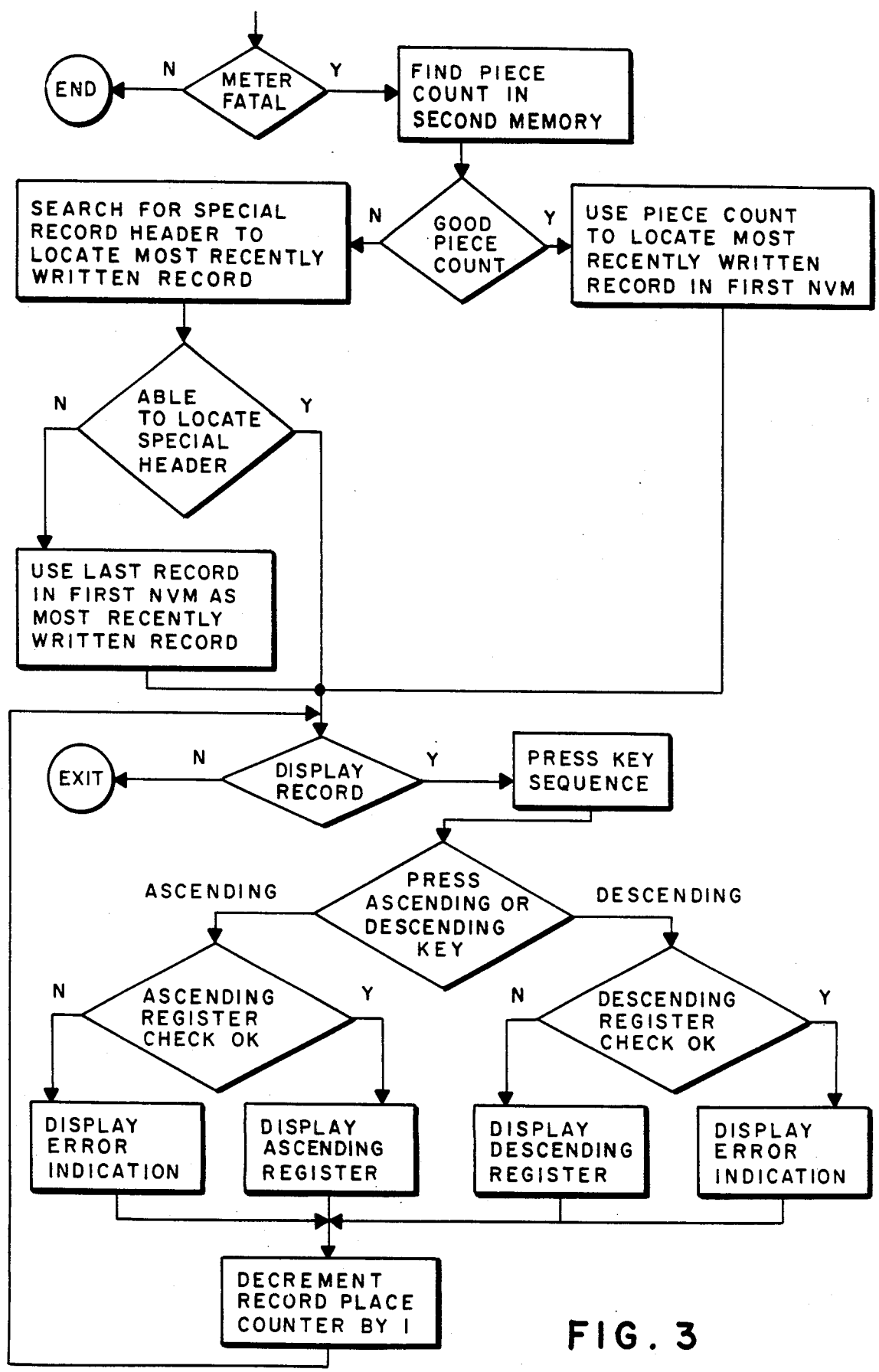
FIG. 3 is a flow chart illustrating a method and apparatus for locating the most recently written record.

FIG. 3 illustrates an advantageous means for locating and displaying the most recently written record in the electronic postage meter The identification of the most recently written record typically refers to the most recently written accounting information written to the ascending and descending register locations of the NVMs 30 and 32. It is important in an electronic postage meter to have record of the various transactions in the meter. A user will be able to readily ascertain what transactions have taken place and thus be able to determine the balance of unused postal funds.

FIG. 3 illustrates in flow chart form a method and system for determining the most recently written record and thereafter being able to display that record in the first non-volatile memory 30 to the appropriate user. The meter should be in a fatal state before this system is implemented to prevent access to non-volatile memory 30 when correct data is available from non-volatile memory 32. When the meter is in a fatal state, the next step is to find an accurate piece count in the second NVM 32. By finding that piece count, it has been found that the most recently written record can be located in the first NVM 30. So, in effect, the cooperation of the first and second non-volatile memories allows for the identification of the most recently written record information into an electronic postage meter.

The record obtained from the first NVM 30 can then be displayed by the meter. As the flow chart indicates, a key sequence is pressed on the electronic postage meter to access either the ascending or descending register information, which thereafter may be decremented. After obtaining that first most recently written record, the subsequent records can be obtained also by pressing the key successive times.

As is indicated, if the most recently written record in the second non-volatile memory is accurate, then the piece count in that record can be used to locate the most recently written record in the first NVM 30. However, if that second NVM record is not accurate, then as is seen in the figure, an alternate path can be taken, namely, a search is made in the first NVM 30 to look for a special record header which will in turn locate the most recently written record.

As is indicated in the figure, if the most recently written record can be obtained in this manner, the record can then be displayed. However, if the special header cannot be located, then the last record in the first NVM 30 will be treated as the most recently written record in an arbitrary fashion and can thereafter be displayed.

To determine if the piece count information is accurate, typically a block cyclical redundancy code (CRC) is provided along with the piece count and other block information, and if that block CRC and the CRC of the block information correspond that includes the piece count, then it is assumed that the piece count is accurate. If, however, the block CRC and the piece count do not correspond, then it is assumed that the piece count is not accurate and the above-mentioned alternate path must be taken. Accordingly, using this alternate path, the information within the NVM 30 can be displayed. Accordingly, a method and apparatus for determining register information in a historical fashion is described. Thus, sequential accounting information may be accessed and displayed dependent upon the users' need.

In addition, register cyclical redundancy codes written to the first NVM 30 are utilized to determine if the descending register or ascending registers are accurate. If, in that comparison between the check value and the register information there is not a correspondence, an error indication will be displayed in adddition to displaying the register information. There are two types of error indications: Err if the transaction value contains non-BCD characters, and x.xxxxxxx if the characters are all BCD. Hence, with this method and apparatus, it is possible to find the most recently written record in the NVM 30 and then historically or sequentially display that information to determine all the written transactions within the meter. It is also possible to determine whether those written transactions are accurate by the use of the check value being provided along with the register information.

It is clear to one ordinarily skilled in the art that other information resident with the second NVM 32 besides the piece count information could be utilized to locate the most recently written record within first NVM 30 and that utilization would still be within the spirit and scope of Applicant's claimed invention.

It should be understood for the purpose of the present application that the term postage meter refers to the general class of devices for the imprinting of a defined unit value for governmental or private carrier delivery of parcels, envelopes or other like applications for unit value printing. Thus, although the term postage meter is utilized, it is both known and employed in the trade as a general term for devices utilized in conjunction with services other than those exclusively employed by governmental postage and tax services. For example, private, parcel and freight services purchase and employ such meters as a means to provide unit value printing and accounting for individual parcels.

Further, it will be apparent to those skilled in the art that various modifications may be made in the present invention without departing from the spirit and scope thereof as described in the specification and defined in the appended claims.

We claim:

1. A method for locating a most recently written record in an electronic postage meter including the steps of:
   providing a first non-volatile memory (NVM) capable of storing accounting data which represents the postage meter transactions;
   updating the first NVM in real time for each postage transaction to provide a current record of the accounting data for each postage transaction on-the-fly;
   providing a second non-volatile (NVM) capable of storing accounting data representing the postage meter-transactions existing at a down cycle of the postage meter;
   detecting a fatal state of the meter, said fatal state allowing programmed access to said first NVM;
   locating information in the second NVM;
   utilizing the information in the second NVM to locate a written transaction within the first NVM that represents the most recently written record in the electronic postage meter; and
   displaying the most recently written record in response to an external message.

2. The method of claim 1 which includes the step of generating the external message via a keyboard.

3. A method for determining whether a record that has been recently written into an electronic postage meter is accurate including the steps of:
   providing a first non-volatile memory NVM capable of storing accounting data which represents the postage meter transactions;
   updating the first NVM in real time for each postage transaction to provide a current record of the accounting data for each postage transaction on-the-fly;
   providing the second non-volatile memory capable of storing accounting data representing the postage meter transactions during a power down cycle of the postage meter;
   detecting a fatal state of the meter, said fatal state allowing programmed access to said first NVM;
   locating a written transaction within the first NVM that represents the most recently written record in the electronic postage meter; and
   providing a check valve along with the written transaction from the first NVM, if the check value and a value corresponding to the written transaction agree, the written record within the first NVM will be displayed to a user indicating the information of the last record is accurate; if the check value and the register information corresponding to the written transaction do not agree, an error indication will be displayed to the user.

4. The method of claim 3 in which the check value is a CRC value.

* * * * *